United States Patent
Blair

[19]

[11] Patent Number: 6,136,705
[45] Date of Patent: Oct. 24, 2000

[54] SELF-ALIGNED DUAL THICKNESS COBALT SILICIDE LAYER FORMATION PROCESS

[75] Inventor: Christopher S. Blair, San Jose, Calif.

[73] Assignee: National Semiconductor Corporation, Santa Clara, Calif.

[21] Appl. No.: 09/176,785

[22] Filed: Oct. 22, 1998

[51] Int. Cl.$^7$ .................................................. H01L 21/44
[52] U.S. Cl. .................... 438/682; 438/683; 438/649; 438/558; 438/533; 438/584; 438/586
[58] Field of Search .................................. 438/682, 683, 438/649, 558, 533, 530, 584, 586, 592

[56] References Cited

U.S. PATENT DOCUMENTS

| | | | |
|---|---|---|---|
| 4,877,755 | 10/1989 | Rodder | 437/200 |
| 5,034,348 | 7/1991 | Hartswick et al. | 437/200 |
| 5,449,642 | 9/1995 | Tan et al. | 438/584 |
| 5,736,461 | 4/1998 | Berti et al. | 438/651 |
| 5,874,342 | 2/1999 | Tsai et al. | 438/301 |
| 5,883,418 | 3/1999 | Kimura | 257/412 |
| 5,902,129 | 5/1999 | Yoshikawa et al. | 438/592 |
| 5,970,370 | 10/1999 | Besser et al. | 438/586 |
| 6,008,111 | 12/1999 | Fushida et al. | 438/584 |

OTHER PUBLICATIONS

Antonio C. Berti, et al., *A Manufacturable Process For The Formation Of Self Aligned Cobalt Silicide In A Sub Micrometer CMOS Technology*, VMIC Conference, Jun. 9–10, 1992, pp. 267–273.

Karen Maex, et al., *Self-Aligned Silicides For ULSI*, Materials Research Society Symposium Proceedings, vol. 260, Apr. 27–May 1, 1992, San Francisco, CA, pp. 133–144.

Wolf, S., et al; *Silicon Processing for the VLSI Era, Vol. 1 Process Technology*, pp. 388–399, Lattice Press (1986).

*Primary Examiner*—David Nelms
*Assistant Examiner*—Reneé R Berry
*Attorney, Agent, or Firm*—Limbach & Limbach LLP

[57] ABSTRACT

A process for the controlled formation of self-aligned dual thickness cobalt silicide layers during the manufacturing of a semiconductor device that requires a minimum number of steps and is compatible with standard MOS processing techniques. In the process according to the present invention, a semiconductor device structure (such as an MOS transistor) is first provided. The semiconductor device structure includes exposed silicon substrate surfaces (such as shallow drain and source regions) and a silicon layer structure disposed above the semiconductor substrate surface (such as a polysilicon gate). A cobalt layer is then deposited over the semiconductor device structure followed by the deposition of a titanium capping layer. Next, the thickness of the titanium capping layer above the silicon layer structure (e.g. a polysilicon gate) is selectively reduced using, for example, chemical mechanical polishing techniques. Cobalt from the cobalt layer is subsequently reacted with silicon from the exposed silicon substrate surfaces to form a first self-aligned cobalt silicide layer on these surfaces. At the same time, cobalt from the cobalt layer is reacted with silicon from the silicon layer structure to form a second self-aligned cobalt silicide layer thereon, which is thicker than the first self-aligned cobalt silicide layer.

13 Claims, 5 Drawing Sheets

SELF-ALIGNED DUAL THICKNESS COBALT SILICIDE LAYER FORMATION PROCESS

BACKGROUND OF THE INVENTION

1. Field of the Invention

The present invention relates to semiconductor device manufacturing processes and, in particular, to processes for the formation of dual thickness cobalt silicide layers during semiconductor device manufacturing.

2. Description of the Related Art

In Metal-Oxide-Semiconductor (MOS) device manufacturing, self-aligned metal silicide layers (also known as "salicide" layers) are useful in reducing the sheet resistance of polysilicon interconnections, source regions and drains regions, as well as contact resistance. See, for example, Stanley Wolf, *Silicon Processing for the VLSI Era*, Vol. I, 388–399 (Lattice Press, 1986).

Figure 1:
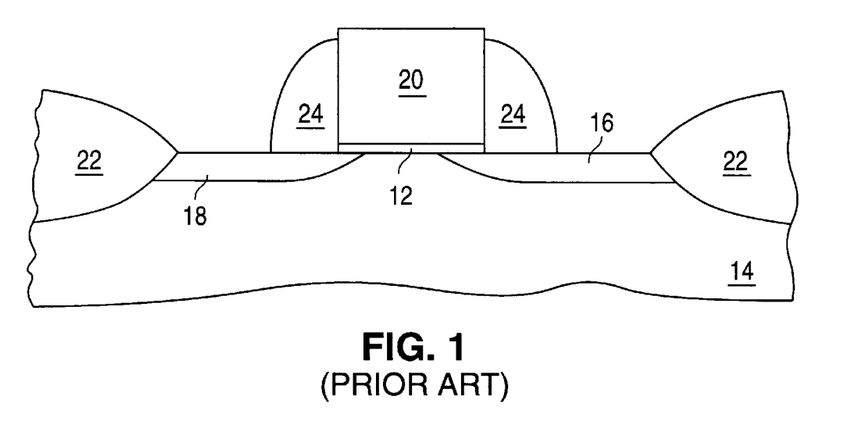
FIG. 1 is a cross-sectional view illustrating a conventional MOS transistor structure prior to the deposition of a metal layer.
Figure 2:
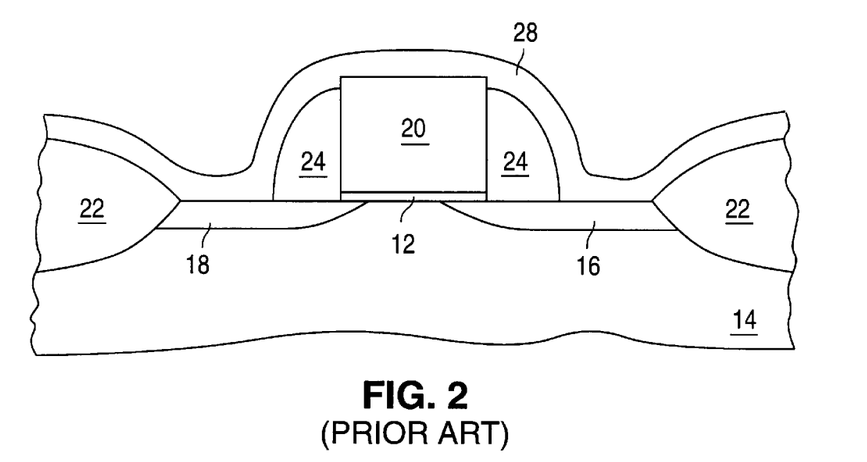
FIG. 2 is a cross-sectional view depicting a conventional MOS transistor structure after deposition of a metal layer.
Figure 3:
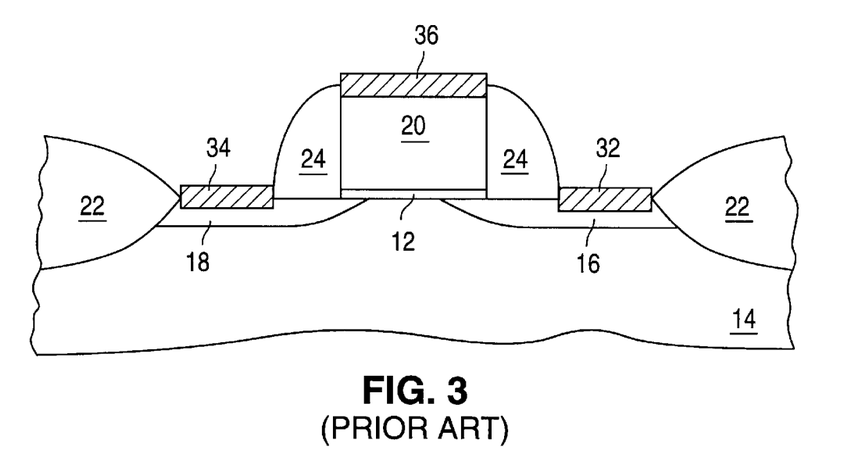
FIG. 3 is a cross-sectional view showing a conventional MOS transistor structure after reacting a metal layer with the silicon surfaces of the source and drain regions and the polysilicon surface of the polysilicon gate.

FIGS. 1–3 illustrate a conventional process for forming a metal silicide layer over a polysilicon gate, a source region and a drain region of an MOS transistor structure. A conventional MOS transistor structure 10 includes a thin gate oxide layer 12 overlying P-type silicon substrate 14 between N-type drain region 16 and N-type source region 18, both of which are formed in P-type silicon substrate 14. A conventional MOS transistor structure 10 also includes a polysilicon gate 20 overlying thin gate oxide layer 12, as well as field oxide regions 22, which isolate MOS transistor structure 10 from neighboring semiconductor device structures (not shown). Gate sidewall spacers 24, typically formed of silicon dioxide or silicon nitride, are disposed on the lateral edges of polysilicon gate 20 and thin gate oxide layer 12.

In a conventional metal silicide formation process, a metal layer 28 is deposited over the surface of MOS transistor structure 10, as illustrated in FIG. 2. Metal layer 28 is ordinarily deposited by a multi-directional evaporative or sputtering-based physical vapor deposition (PVD) process or a multi-directional chemical vapor deposition (CVD) process and is, therefore, of essentially uniform thickness over the entire surface of MOS transistor structure 10.

Wherever metal layer 28 is in contact with silicon surfaces (i.e. source region 18, drain region 16 and the polysilicon surface of polysilicon gate 20) the metal is reacted to form a metal silicide layer. The reaction conditions, such as temperature and gaseous ambient, employed for the metal silicide layer formation are selected to foster the reaction of the metal layer with silicon surfaces while impeding reaction of the metal layer with silicon dioxide or silicon nitride surfaces (i.e. the gate sidewall spacers and field oxide regions).

A selective etch is then used to remove unreacted metal from the surface of the gate sidewall spacers and field oxide regions, as well as any unreacted metal residue still remaining above the source region, drain region and polysilicon gate. The etch is "selective" since it does not remove the metal silicide layer that was formed on the surface of the silicon and polysilicon regions. The result, illustrated in FIG. 3, is a metal silicide layer 32 on the surface of drain region 16, a metal silicide layer 34 on the surface of source region 18 and a metal silicide layer 36 on the surface of polysilicon gate 20.

The use of cobalt silicide layers is becoming increasingly common in semiconductor devices. During cobalt silicide layer formation it is often beneficial to utilize a bilayer system, which includes an initially deposited cobalt layer covered with a "capping" layer of titanium, titanium-tungsten (TiW), or titanium-nitride (TiN), prior to the reaction of the cobalt with silicon surfaces to form cobalt silicide layers. The use of capping layers is reported to improve device electrical parameters, to reduce cobalt overgrowth of oxide regions and, in the case of titanium capping layers, to provide a gettering mechanism that prevents cobalt oxidation during the silicide formation process. See, for example, Berti et al., U.S. Pat. No. 5,736,461; A. C. Berti and V. Bolkhovsky, *A Manufacturable Process for the Formation of Self Aligned Cobalt Silicide in a Sub Micrometer CMOS Technology*, VMIC Conference, June 9–10, 267–273 (1992); and K. Maex and R. Schreutelkamp, *Self-Aligned Silicides for ULSI*, Mat. Res. Soc. Symp. Proc., Vol. 260, 133–144 (1992), all of which are hereby incorporated by reference.

Conventional cobalt silicide processes can result in the formation of cobalt silicide layers on the source region, drain region and polysilicon gate that are all of essentially the same thickness. Since silicide layer thickness is, however, a critical factor in semiconductor device performance, it is often desirable to form cobalt silicide layers of different thicknesses on separate regions of a semiconductor device in a controllable manner. For example, semiconductor devices with shallow source and drain region junction depths may require a relatively thin cobalt silicide layer on those regions, in order to reduce the risk of junction spiking, while still requiring a relatively thick cobalt silicide layer on the polysilicon gate so as to reduce polysilicon sheet resistance.

U.S. Pat. No. 4,877,755 to Rodder describes a lengthy and complex dual thickness silicide process. This process relies on two separately applied silicide barrier layers that are intended to sequentially block metal silicide layer formation on the gate polysilicon and source and drain regions. Such a process is undesirable from the standpoint of both cost and processing time since it requires two metal silicide formation steps as well as two silicide barrier layer deposition steps.

U.S. Pat. No. 5,034,348 to Hartswick et al. describes a dual thickness silicide process, which includes a step of applying a refractory metal layer (such as titanium) over the gate polysilicon layer prior to gate polysilicon patterning. In this process, following gate polysilicon patterning, the refractory metal layer is reacted with the gate polysilicon to form a first metal silicide layer on the gate polysilicon. A second metal silicide layer is subsequently formed over the source and drain regions. In addition to requiring two metal silicide formation steps, this process suffers from other limitations that render it unsuitable for use in conventional MOS processing. For example, the process makes it difficult to dope the polysilicon gate underneath the first metal silicide layer during conventional source and drain region formation processes, as well as to pattern the refractory metal/polysilicon multilayer gate structure to deep submicron dimensions.

Needed in the field is a process for the controlled formation of dual thickness cobalt silicide layers on a semiconductor device that requires a minimum number of steps and is compatible with standard MOS processing.

SUMMARY OF THE INVENTION

The present invention provides a process for forming self-aligned dual thickness cobalt silicide layers during the manufacturing of a semiconductor device. The process requires a minimum number of steps, is compatible with standard MOS processing techniques and provides for the controlled formation of dual thickness cobalt silicide layers.

In the process according to the present invention, a semiconductor device structure (such as an MOS transistor)

is first provided. The semiconductor device structure includes a silicon substrate with at least one exposed silicon substrate surface (such as a source or drain region of an MOS transistor), as well as a silicon layer structure with an exposed silicon surface disposed above the semiconductor substrate surface (such as a polysilicon gate of an MOS transistor). A cobalt layer is then deposited over the semiconductor device structure, followed by a deposition of a titanium capping layer on the cobalt layer. The thickness of the titanium capping layer above the silicon layer structure (e.g. a polysilicon gate) is thereupon selectively reduced using, for example, chemical mechanical polishing techniques. The thickness reduction process employed here is referred to as "selective" since it preferentially reduces the titanium capping layer thickness in one area, such as above the silicon layer structure, over that in other areas, such as above the exposed silicon substrate surface. Cobalt in the cobalt layer is then reacted with silicon in the exposed silicon substrate surface (e.g. source and drain regions) and the silicon layer structure (e.g. a polysilicon gate), thereby forming a first self-aligned cobalt silicide layer on the exposed silicon substrate surface and a second self-aligned cobalt silicide layer on the silicon layer structure. The second self-aligned cobalt silicide layer on the silicon layer structure is thicker than the thickness of the first self-aligned cobalt silicide layer on the exposed silicon substrate surface.

As is evident from the detailed description below, the key to the formation of self-aligned dual thickness cobalt silicide layers in processes according to the present invention is the selective reduction of titanium capping layer thickness in an area where a thick self-aligned cobalt silicide layer is to be formed, in comparison to an area where a thin self-aligned cobalt silicide layer is to be formed. The self-aligned cobalt silicide layer thickness that results from the cobalt-silicon reaction is inversely proportional to the overlying titanium capping layer thickness. Therefore, upon the cobalt-silicon reaction, relatively thick self-aligned cobalt silicide layers are formed underneath the titanium capping layer whose thickness was selectively reduced, while relatively thin self-aligned cobalt silicide layers are formed underneath the titanium capping layer whose thickness was substantially unaffected by the selective reduction process.

In one embodiment, a titanium-nitride capping layer is additionally deposited over the titanium capping layer after the selective reduction of the titanium capping layer thickness.

BRIEF DESCRIPTION OF THE DRAWING

A better understanding of the features and advantages of the present invention will be obtained by reference to the following detailed description that sets forth illustrative embodiments in which the principles of the invention are utilized, and the accompanying drawings of which.

DETAILED DESCRIPTION OF THE INVENTION

Figure 4:
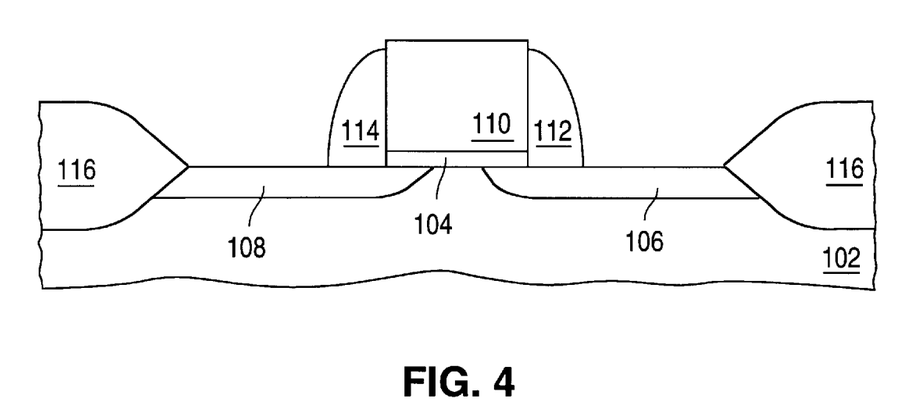
FIGS. 4–9 are cross-sectional views illustrating stages in one embodiment of a process according to the present invention.

FIGS. 4–9 illustrate stages of a process for the formation of self-aligned dual thickness cobalt silicide layers on a semiconductor device according to the present invention. A MOS transistor structure 100 with silicon substrate 102 of a first conductivity type, typically P-type, is initially provided as shown in FIG. 4. The MOS transistor structure 100 also includes a thin gate oxide layer 104 (typically less than 100 angstroms thick) overlying silicon substrate 102 between shallow drain region 106 and shallow source region 108, both of which are formed in silicon substrate 102. Shallow drain region 106 and shallow source region 108 are of a second conductivity type opposite that of silicon substrate 102. A polysilicon gate 110 (typical thickness being in the range between 2000 and 3000 angstroms) overlies thin gate oxide layer 104.

MOS transistor structure 100 also includes first gate sidewall spacer 112 and second gate sidewall spacer 114, both of which abut the lateral surfaces of polysilicon gate 110 and thin gate oxide layer 104. Further, first gate sidewall spacer 112 extends over shallow drain region 106 and second gate sidewall spacer 114 extends over shallow source region 108. These gate sidewall spacers are made, for example, of CVD silicon nitride or silicon dioxide and have a typical width in the range of 1000 to 1400 angstroms. Field oxide regions 116 separate MOS transistor structure 100 from neighboring semiconductor device structures (not shown).

If desired, the surface of MOS transistor structure 100 can be prepared for the subsequent deposition of a cobalt layer 118 (as described below) in a conventional manner, such as by the use of HF-based solutions to remove unwanted oxide layers covering the shallow drain region, the shallow source region, or the polysilicon gate, thereby insuring the cobalt layer's direct contact with the underlying silicon.

Figure 5:
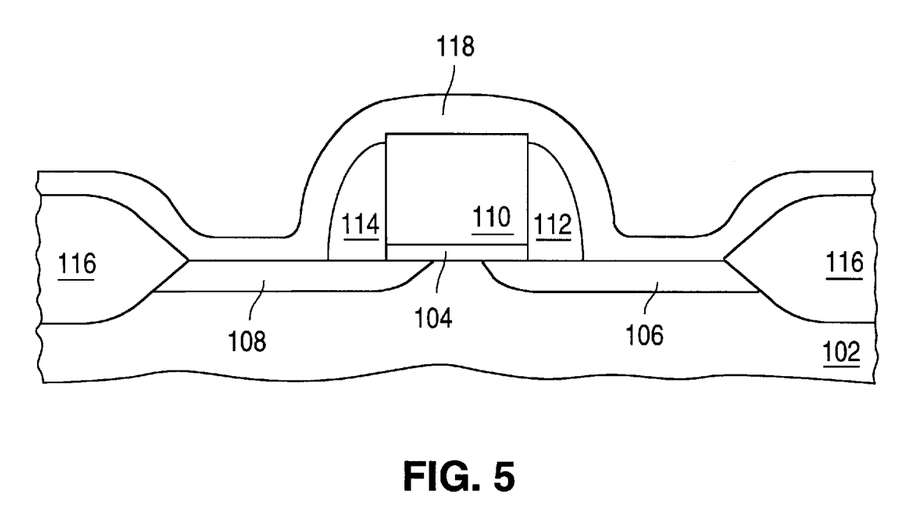

Next, cobalt layer 118 is deposited over MOS transistor structure 100 completely covering the shallow drain region 106, shallow source region 108, polysilicon gate 110, field oxide regions 116, first gate sidewall spacer 112 and second gate sidewall spacer 114. The resultant structure is illustrated in FIG. 5. The cobalt layer thickness is preferably in the range of 75 to 200 angstroms although thicker and thinner cobalt layers can also be employed. Cobalt layer 118 can be deposited by any process known in the art, for example sputtering or chemical vapor deposition.

Figure 6:
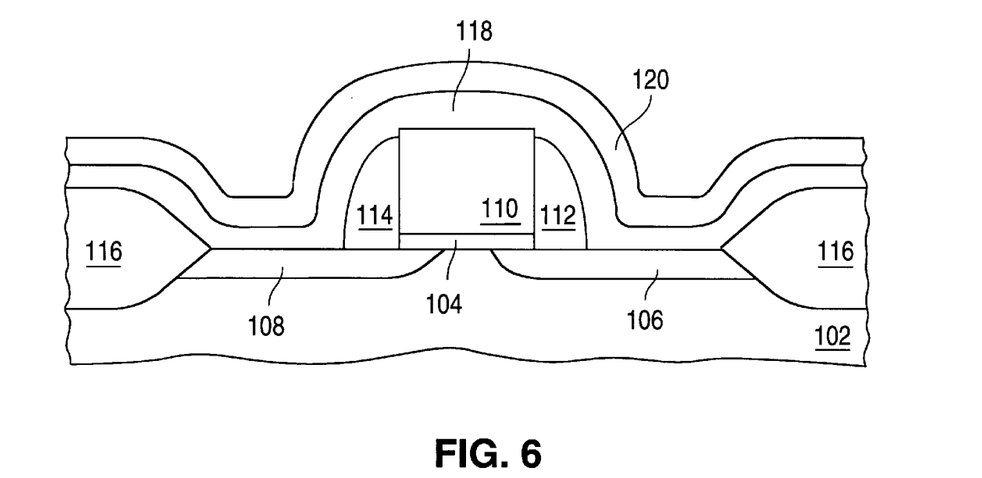
Figure 7:
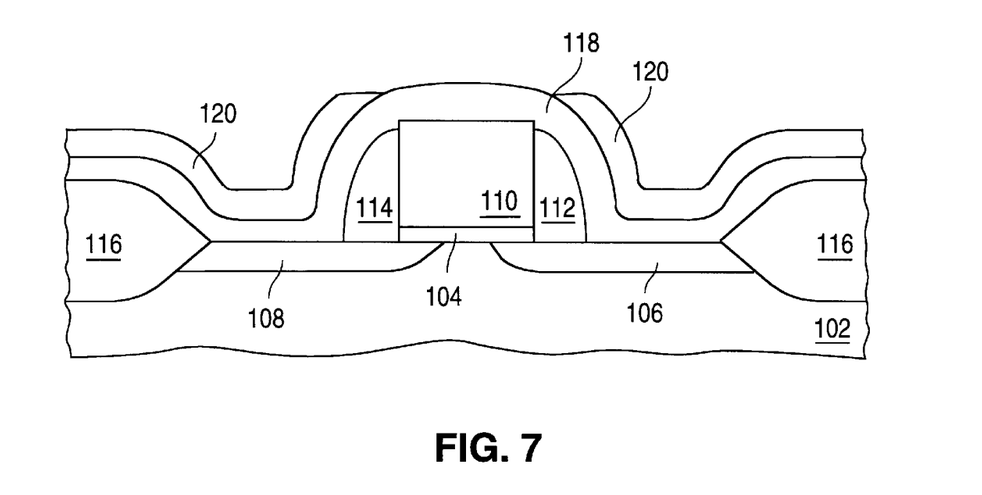

Next, a titanium capping layer 120 (typically 50 to 200 angstroms in thickness) is deposited over cobalt layer 118 using conventional sputtering techniques. The resulting structure is illustrated in FIG. 6. The thickness of the titanium capping layer above the polysilicon gate is then selectively reduced. The term "reduced" encompasses a complete reduction, in which the titanium capping layer thickness above the polysilicon gate has been reduced to zero, i.e. the titanium capping layer has been completely eliminated above the polysilicon gate (as illustrated in FIG. 7). This selective thickness reduction step can be accomplished using, for example, standard titanium chemical mechanical polishing (CMP) equipment and techniques, such as a Speedfam Auriga CMP tool with a K-Groove polishing pad and $KIO_3/Al_2O_3$-based slurry.

The motivation for selectively reducing the thickness of the titanium capping layer above the polysilicon gate is based on the discovery that the thickness of cobalt silicide layers resulting from a reaction of cobalt in the cobalt layer with the directly underlying silicon is inversely related to the thickness of the titanium capping layer overlying the very cobalt layer. Table 1 below lists the sheet resistance data of cobalt silicide layers formed underneath of a titanium capping layer of various thicknesses, namely a 150 angstrom titanium (Ti) capping layer, a 75 angstrom Ti capping layer and a titanium nitride (TiN) capping layer in the absence of a Ti capping layer. All other factors were held constant in obtaining these data. The data in Table 1 demonstrate that the cobalt silicide layer thickness, which is inversely proportional to sheet resistance of the cobalt silicide layer itself, is a function of titanium capping layer thickness.

TABLE 1

| Ti Capping Layer Thickness | Cobalt Silicide Sheet Resistance |
|---|---|
| 150 Angstroms | 7.1 ohms/square |
| 75 Angstroms | 5.2 ohms/square |
| 0 Angstroms (with TiN cap) | 3.4 ohms/square |

The presence of a titanium capping layer overlying a cobalt layer prevents a portion of the cobalt layer from reacting with silicon to form cobalt silicide. The result of this interaction between the titanium capping layer and the cobalt layer during cobalt silicide formation is the production of thinner cobalt silicide layers as the thickness of the titanium capping layer increases. The formation of self-aligned cobalt silicide layers of two different thicknesses (i.e. dual thickness) in a MOS transistor according to the present invention takes advantage of this interaction.

It is believed that the "prevention effect" of the titanium capping layer on the formation of a cobalt silicide layer plateaus for titanium capping layers above 150 angstroms in thickness. Processes according to the present invention, however, can controllably form self-aligned dual thickness cobalt silicide layers by selectively reducing the titanium capping layer thickness over those areas where a thicker cobalt silicide layer is desired, while maintaining the titanium capping layer thickness substantially unaffected by the selective reduction process over the other areas where a thinner cobalt silicide layer is desired. For example, a thicker cobalt silicide layer may be desired over the polysilicon gate for increasing its conductivity, while a thinner cobalt silicon layer may be desired over the shallow drain and source regions for preventing junction spiking.

When the "complete" reduction of the titanium capping layer occurs, either purposely or inadvertently, during the selective reduction step, a minimal reduction in thickness of the cobalt layer disposed directly above the polysilicon gate is permissible. However, since the purpose of the process according to the present invention is to produce a relatively thick cobalt silicide layer on the polysilicon gate, a significant reduction in thickness of the cobalt layer disposed directly above the polysilicon gate would be counterproductive.

Since the height of the polysilicon gate above the semiconductor substrate is the controlling factor in providing a selective reduction in thickness of the titanium capping layer disposed above the polysilicon gate during CMP processing, processes according to the present invention can be used to form a relatively thick cobalt silicide layer on any silicon layer structure that is taller than (i.e. higher or disposed above) the exposed silicon substrate surface on which a formation of a relatively thin cobalt silicide layer is desired.

Figure 8:
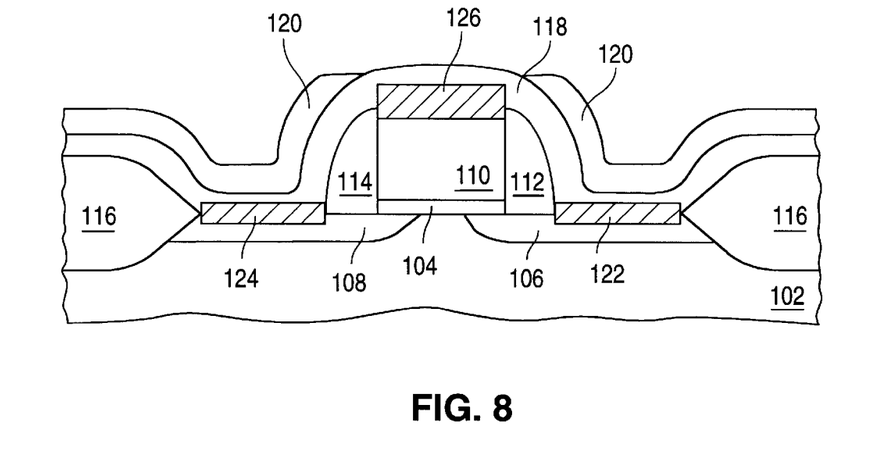
Figure 9:
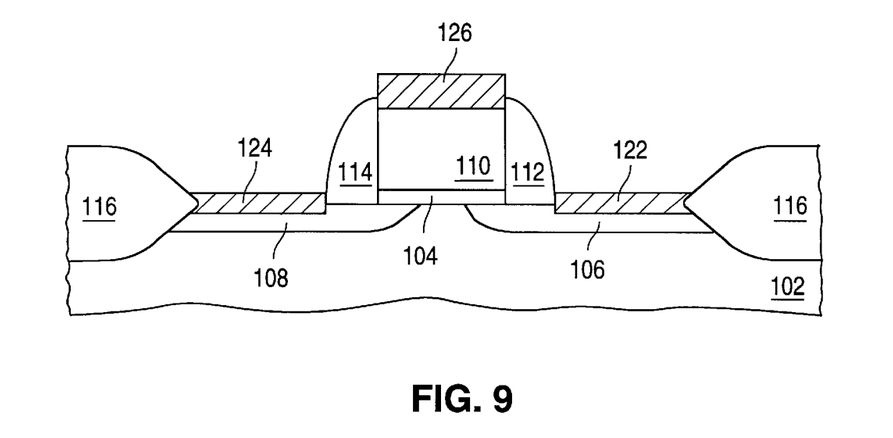

Following the step of reducing the titanium capping layer thickness above the polysilicon gate, cobalt in the cobalt layer 118 that is in direct contact with silicon in the shallow drain region 106, shallow source region 108, and polysilicon gate 110 is reacted to form self-aligned dual thickness cobalt silicide (CoSi) layers 122, 124 and 126 on these regions (see FIG. 8). Since the thickness of the titanium capping layer 120 above the polysilicon gate 110 was selectively reduced relative to its thickness above the shallow drain and source regions 106 and 108, the resultant cobalt silicide (CoSi) layer 126 above the polysilicon gate 110 is thicker than cobalt silicide (CoSi) layers 122 and 124 that are formed above the shallow drain and source regions 106 and 108, respectively. By manipulating the relative thicknesses of the titanium capping layer above the polysilicon gate versus above the shallow drain and source regions, self-aligned dual thickness cobalt silicide layers can be formed in a controllable manner.

The term "self-aligned" used in connection with the present invention serves as a dual reference: one is that the cobalt silicide layers 122, 124 and 126 are "self-aligned" to the silicon surfaces of the shallow drain region 106, shallow source region 108, and polysilicon gate 110, respectively; and the other is that a relatively thick cobalt silicide layer 126 is "self-aligned" to the polysilicon gate 110, while relatively thin cobalt silicide layers 122 and 124 are "self-aligned" to the shallow drain and source regions 106 and 108. This "self-aligned" nature of the dual thickness cobalt silicide layers is a result of the implementation of the selective reduction step of the titanium capping layer thickness above the polysilicon gate 110.

The cobalt-silicon reaction can be conducted using procedures well known to those skilled in the art. Typical procedures employ elevated temperatures, around 450–550° C., in nitrogen for 30 seconds to 2 minutes, in order to foster the silicide formation and the reactions are normally conducted in a rapid thermal processor (RTP).

Next, the cobalt layer 118 (i.e. unreacted cobalt from the cobalt-silicon reaction to form a cobalt silicide layer) and the titanium capping layer 120 are removed using a conventional selective wet etch, such as a mixture of sulfuric acid and hydrogen peroxide, or a mixture of phosphoric acid, acetic acid, nitric acid and hydrogen peroxide. The resultant structure, illustrated in FIG. 9, includes a relatively thin self-aligned cobalt silicide (CoSi) layers 122 and 124 on the shallow drain region 106 and the shallow source region 108, respectively, and a relatively thick self-aligned cobalt salicide layer 126 on the polysilicon gate 110. A second thermal step is then used to convert the cobalt silicide (CoSi) layers to cobalt silicide ($CoSi_2$) layers. This second thermal can be conducted in an RTP at 650–850° C. for 30 seconds to 2 minutes in an $N_2$ ambient.

Processes according to the present invention can form self-aligned dual thickness cobalt silicide layers where the relatively thick cobalt silicide layer is up to two or more times greater in thickness than the relatively thin cobalt silicide layers. The typical thickness range for the relatively thin cobalt silicide ($CoSi_2$) layers is from 100 to 400 angstroms, while the relatively thick cobalt silicide ($CoSi_2$) layer is from greater than 100 to 800 angstroms.

Figure 10:
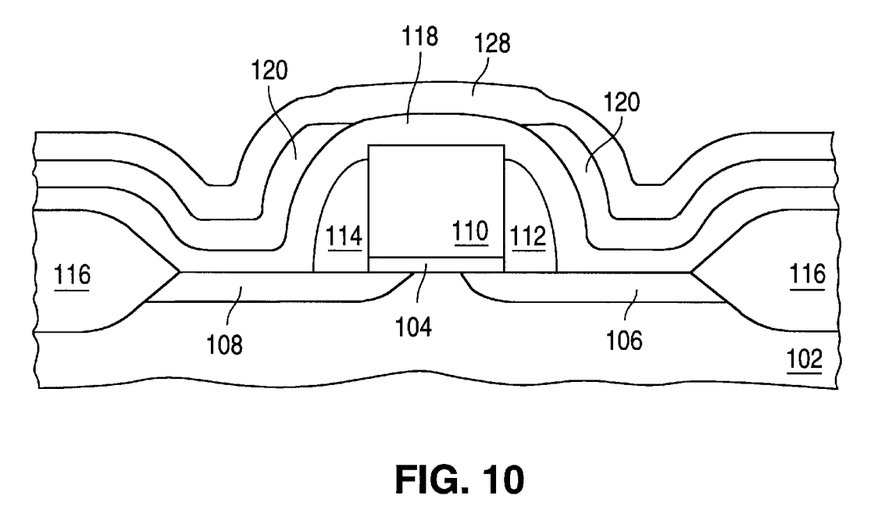
FIGS. 10–11 are cross-sectional views illustrating stages in another embodiment of a process according to the present invention.

In one embodiment of a process according to the present invention, following the step of selectively reducing the titanium capping layer thickness above the polysilicon gate, a titanium-nitride (TiN) capping layer 128 is deposited over the titanium capping layer, as illustrated in FIG. 10. The titanium capping layer 120 is capable of gettering oxygen during the silicide formation process, and thus preventing undesirable cobalt layer oxidation, by isolating the cobalt layer from oxygen that may be in the processing environment. This appears to be true even if the titanium capping layer has been completely removed during the selective reduction step from above the polysilicon gate 110, since the titanium capping layers above the shallow drain and source regions 106 and 108 provide a sufficient "oxygen gettering" mechanism for the entire MOS transistor structure. The presence of a TiN capping layer 128 provides additional assurance by further isolating the cobalt layer from oxygen that may be in the processing environment. The TiN capping layer is not known to have any adverse interactions with cobalt as far as the formation of cobalt silicide layers is concerned. The TiN capping layer can be deposited by sputtering or CVD and has a typical thickness of around 200 angstroms.

Figure 11:
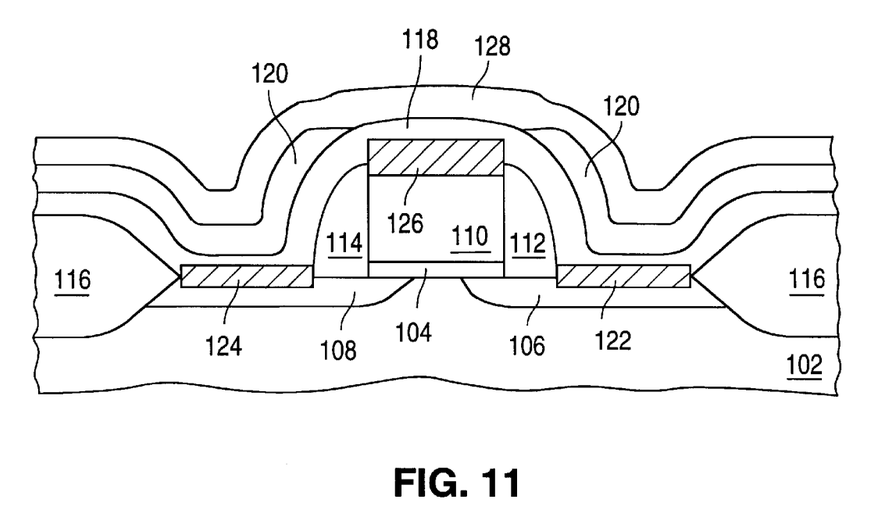

Next, as described above with respect to the embodiment illustrated in FIGS. 4–9, cobalt in the cobalt layer 118 that is in direct contact with silicon in the shallow drain region 106, the shallow source region 108, and the polysilicon gate 110 is reacted to form self-aligned dual thickness cobalt silicide (CoSi) layers 122, 124 and 126 on these regions (see FIG. 11). The cobalt layer 118 (i.e. unreacted cobalt from the cobalt-silicon reaction to form a cobalt silicide layer), the titanium capping layer 120 and the TiN capping layer 128 are then removed using a conventional selective wet etch, such as a mixture of sulfuric acid and hydrogen peroxide, or a mixture of phosphoric acid, acetic acid, nitric acid and hydrogen peroxide. The resultant structure, equivalent to that illustrated in FIG. 9, includes a relatively thin self-aligned cobalt silicide (CoSi) 122 and 124 layers on the shallow drain region 106 and the shallow source region 108, respectively, and a relatively thick self-aligned cobalt silicide layer 126 on the polysilicon gate 110. A second thermal step, similar to the one described above, is subsequently performed.

It should be understood that various alternatives to the embodiments of the invention described herein may be employed in practicing the invention. It is intended that the following claims define the scope of the invention and that processes within the scope of these claims and their equivalents be covered thereby.

What is claimed is:

1. A method for forming self-aligned dual thickness cobalt silicide layers during the manufacturing of a semiconductor device, the method comprising the steps of:
    providing a semiconductor device structure including:
        a silicon substrate with at least one exposed silicon substrate surface; and
        a silicon layer structure disposed above the silicon substrate, the silicon layer structure having an exposed silicon layer structure surface;
    depositing a cobalt layer on the semiconductor device structure;
    depositing a titanium capping layer on the cobalt layer;
    selectively reducing the thickness of the titanium capping layer above the exposed silicon layer structure surface;
    reacting cobalt in the cobalt layer with silicon in the exposed silicon substrate surface and silicon in the exposed silicon layer structure surface to form a first self-aligned cobalt silicide (CoSi) layer on the exposed silicon substrate surface and to concurrently form a second self-aligned cobalt silicide (CoSi) layer on the exposed silicon layer structure surface, the first self-aligned cobalt silicide (CoSi) layer being thinner than the second self-aligned cobalt silicide (CoSi) layer; and
    removing the titanium capping layer and any unreacted cobalt.

2. The method of claim 1 wherein the providing step includes providing a MOS transistor with a shallow drain region, a shallow source region and a polysilicon gate.

3. The method of claim 1 wherein the step of depositing a cobalt layer includes depositing a cobalt layer with a thickness in the range of 75 to 200 angstroms.

4. The method of claim 1 wherein the step of depositing a titanium capping layer includes depositing a titanium capping layer with a thickness in the range of 50 to 200 angstroms.

5. The method of claim 1 wherein the selectively reducing step includes selectively reducing the thickness of the titanium capping layer above the exposed silicon layer structure surface using a chemical mechanical polishing process.

6. The method of claim 1 wherein the reacting step includes reacting cobalt in the cobalt layer with silicon in the exposed silicon substrate surface and silicon in the exposed silicon layer structure surface to form a first self-aligned cobalt silicide (CoSi) layer of a thickness in the range of 100 to 400 angstroms on the exposed silicon substrate surface and to form a second self-aligned cobalt silicide (CoSi) layer of a thickness range from greater than 100 to 800 angstroms on the exposed silicon layer structure surface.

7. The method of claim 1 further including the step of:
    depositing a titanium-nitride capping layer, after the selectively reducing step and before the reacting step, and
    wherein the removing step also includes removing the titanium-nitride capping layer.

8. The method of claim 1 further including the step of:
    converting the first self-aligned cobalt silicide (CoSi) layer and the second self-aligned cobalt silicide (CoSi) layer to a first self-aligned $CoSi_2$ layer and a second self-aligned $CoSi_2$ layer, after the removing step.

9. The method of claim 7 further including the step of:
    converting the first self-aligned cobalt silicide (CoSi) layer and the second self-aligned cobalt silicide (CoSi) layer to a first self-aligned $CoSi_2$ layer and a second self-aligned $CoSi_2$ layer, after the removing step.

10. The method of claim 1 wherein the reacting step includes reacting cobalt in the cobalt layer with silicon in the exposed silicon substrate surface and silicon in the exposed silicon layer structure surface to form a first self-aligned cobalt silicide (CoSi) layer on the exposed silicon substrate surface and to form a second self-aligned cobalt silicide (CoSi) layer on the exposed silicon layer structure surface, the second self-aligned cobalt silicide (CoSi) layer being up to two times thicker than the first self-aligned cobalt silicide (CoSi) layer.

11. A method for forming self-aligned dual thickness cobalt silicide layers during the manufacturing of a semiconductor device, the method comprising the steps of:
    providing an MOS transistor structure including:
        a silicon substrate;
        shallow drain region and shallow source region in the silicon substrate; and
        a polysilicon gate disposed over the silicon substrate;
    depositing a cobalt layer on the MOS transistor structure covering the shallow drain region, the shallow source region and the polysilicon gate;
    depositing a titanium capping layer on the cobalt layer;
    selectively reducing the thickness of the titanium capping layer above the polysilicon gate without significantly reducing the thickness of the titanium capping layer above the shallow drain region and the shallow source region, using a chemical mechanical polishing process;

reacting cobalt in the cobalt layer with silicon in the shallow drain region, the shallow source region and the polysilicon gate to form first self-aligned cobalt silicide (CoSi) layers on the shallow drain region and the shallow source region, and to concurrently form a second self-aligned cobalt silicide (CoSi) layer on the polysilicon gate, wherein the first self-aligned cobalt silicide (CoSi) layers are thinner than the second self-aligned cobalt silicide (CoSi) layer; and removing the titanium capping layer and any unreacted cobalt.

12. The method of claim 11 further including the step of:

depositing a titanium-nitride capping layer, after the selectively reducing step and before the reacting step, and wherein the removing step includes removing the titanium-nitride capping layer.

13. The method of claim 12 further including the step of:

converting the first self-aligned cobalt silicide (CoSi) layers and the second self-aligned cobalt silicide (CoSi) layer to first self-aligned $CoSi_2$ layers and a second self-aligned $CoSi_2$ layer, after the removing step.

* * * * *